(12) United States Patent
Ansems et al.

(10) Patent No.: US 7,659,545 B2
(45) Date of Patent: Feb. 9, 2010

(54) ILLUMINATION SYSTEM

(75) Inventors: Johannes Petrus Maria Ansems, Eindhoven (NL); Christoph Gerard August Hoelen, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 440 days.

(21) Appl. No.: 11/721,169

(22) PCT Filed: Dec. 5, 2005

(86) PCT No.: PCT/IB2005/054045

§ 371 (c)(1),
(2), (4) Date: Jun. 8, 2007

(87) PCT Pub. No.: WO2006/061763

PCT Pub. Date: Jun. 15, 2006

(65) Prior Publication Data

US 2009/0283780 A1    Nov. 19, 2009

(30) Foreign Application Priority Data

Dec. 9, 2004  (EP) .................. 04106407

(51) Int. Cl.
H01L 33/00  (2006.01)
(52) U.S. Cl. ............... 257/88; 257/89; 257/95; 257/98; 257/99; 257/E33.001
(58) Field of Classification Search ........... 257/88, 257/89, 95, 98, 99
See application file for complete search history.

(56) References Cited

U.S. PATENT DOCUMENTS

| 5,748,161 | A  | * | 5/1998  | Lebby et al. ............. 345/84 |
| 5,952,681 | A  |   | 9/1999  | Chen |
| 6,513,949 | B1 |   | 2/2003  | Marshall et al. |
| 6,784,463 | B2 | * | 8/2004  | Camras et al. ............ 257/99 |
| 7,289,089 | B2 | * | 10/2007 | Iwafuchi ............... 345/82 |
| 2001/0005319 | A1 | | 6/2001 | Ohishi et al. |

FOREIGN PATENT DOCUMENTS

| EP | 1103759   | 5/2001  |
| EP | 1416219   | 5/2004  |
| JP | 11163415  | 6/1999  |
| WO | 9748138   | 12/1997 |
| WO | 0019546   | 4/2000  |
| WO | 0141215   | 6/2001  |

* cited by examiner

*Primary Examiner*—Wai-Sing Louie

(57) ABSTRACT

An illumination system has a mounting substrate (4) for mounting and electrically contacting a plurality of light-emitting diodes (R, A, G, B). A first category of the light-emitting diodes (G, B) comprises a first translucent substrate (11) provided with an active layer (1) on an outer surface (13) of the first translucent substrate facing the mounting substrate (4); electrical contacts are provided at a side facing the mounting substrate. A second category of the light-emitting diodes (R, A) comprises an active layer (2) arranged on a second translucent substrate (12); at least one electrical contact is provided at a side facing away from the mounting substrate. Each light-emitting diode of the first category is provided on a first sub mount (21). Each light-emitting diode of the second category is provided on a second sub mount (22). The first and second sub mount are provided on the mounting substrate.

8 Claims, 2 Drawing Sheets

ILLUMINATION SYSTEM

Figure 1:
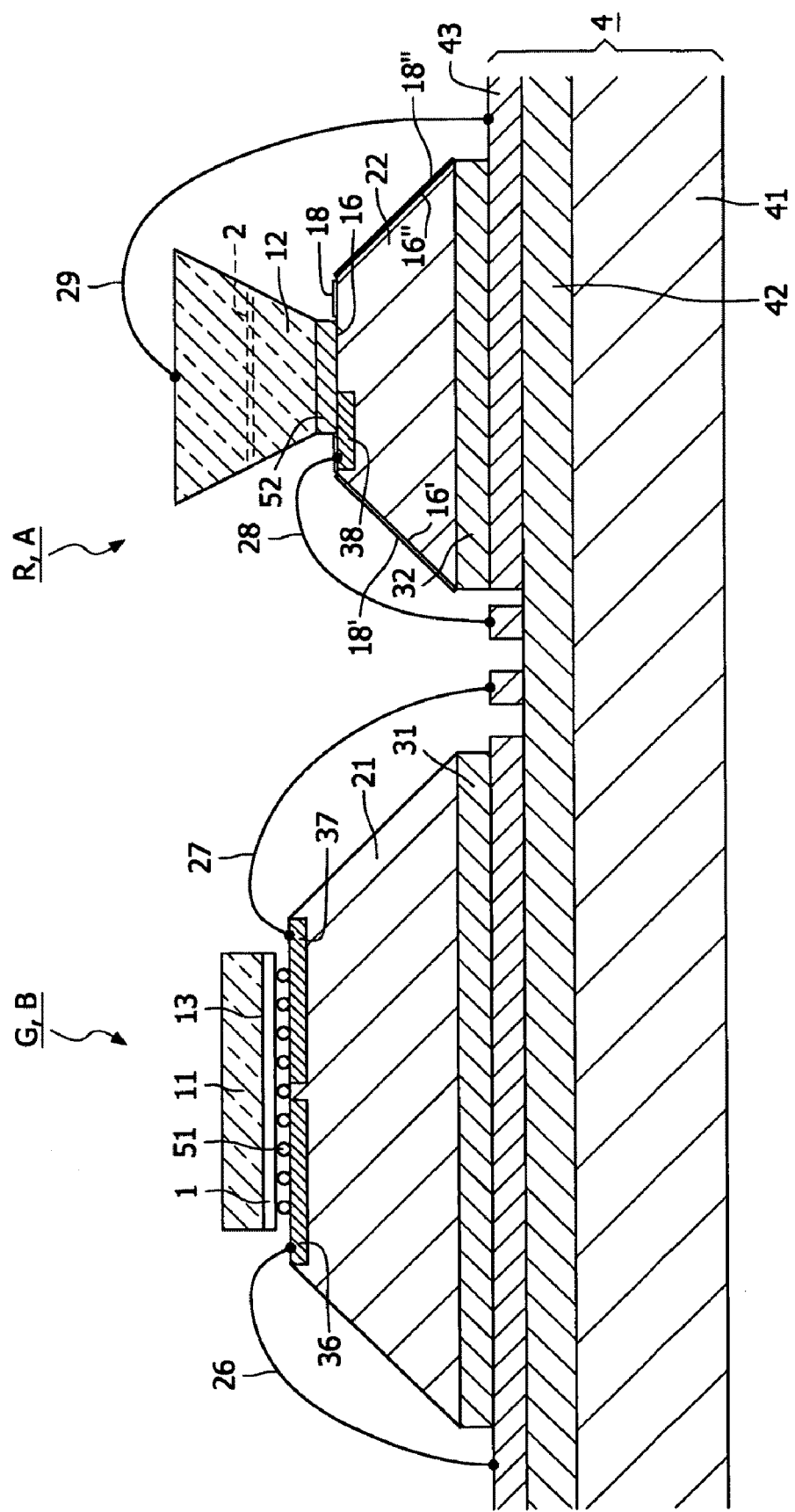

The invention relates to an illumination system comprises a mounting substrate provided with a plurality of light-emitting diodes.

Such illumination systems are known per se. They are used, inter alia, as backlighting of (image) display devices, for example for television receivers and monitors. Such illumination systems can particularly suitably be used as a backlight for non-emissive displays, such as liquid crystal display devices, also referred to as LCD panels, which are used in (portable) computers or (cordless) telephones. Another application area of the illumination system according to the invention is the use as illumination source in a digital projector or so-called beamer for projecting images or displaying a television program, a film, a video program or a DVD, or the like. In addition, such illumination systems are used for general lighting purposes, such as spot lights, accent lighting, flood lights and for large-area direct-view light emitting panels such as applied, for instance, in signage, contour lighting, and billboards. In other applications, the light emitted by such illumination systems is fed into a light guide, optical fiber or other beam-shaping optics.

Generally, such illumination systems comprise a multiplicity of light emitters, for instance light-emitting diodes (LEDs). LEDs can be light sources of distinct primary colors, such as, for example the well-known red (R), green (G), or blue (B) light emitters. In addition, the light emitter can have, for example, amber (A), magenta or cyan as primary color. These primary colors may be either generated directly by the light-emitting-diode chip, or may be generated by a phosphor upon irradiance with light from the light-emitting-diode chip. In the latter case, also mixed colors or white light is possible as one of the primary colors. Generally, the light emitted by the light emitters is mixed in the transparent and/or translucent element(s) to obtain a uniform distribution of the light while eliminating the correlation of the light emitted by the illumination system to a specific light emitter. In addition, it is known to employ a controller with a sensor and some feedback algorithm in order to obtain high color accuracy.

US granted U.S. Pat. No. 6,513,949 discloses a hybrid lighting system for producing white light including at least one light-emitting diode (LED) and phosphor-light emitting diode. The hybrid lighting system exhibits improved performance over conventional LED lighting systems that use LEDs or phosphor-LEDs to produce white light. In particular, the hybrid system of the invention permits different lighting system performance parameters to be addressed and optimized as deemed important, by varying the color and number of the LEDs and/or the phosphor of the phosphor LED. A drawback of the known illumination system is that the efficacy of the respective LED's is not sufficiently high.

The invention has for its object to eliminate the above disadvantage wholly or partly. According to the invention, this object is achieved by an illumination system comprising:

a mounting substrate for mounting and electrically contacting a plurality of light-emitting diodes, a first category of the light-emitting diodes comprising a first translucent substrate provided with an active layer on an outer surface of the first translucent substrate facing the mounting substrate, electrical contacts being provided at a side facing the mounting substrate, a second category of the light-emitting diodes comprising an active layer arranged on a second translucent substrate, at least one electrical contact being provided at a side facing away from the mounting substrate, each light-emitting diode of the first category being provided on a first sub mount, each light-emitting diode of the second category being provided on a second sub mount, the first and the second sub mount being provided on the mounting substrate.

According to the invention, each of the categories of light-emitting diodes in the illumination system is arranged on a sub mount. By mounting the LEDs in this manner, the efficacy of the illumination system is improved. In addition, by mounting the LEDs in this manner, the packing density of the illumination system can be increased. Preferably, the first category of light-emitting diodes comprises InGaN LEDs, and the second category of light-emitting diodes comprises AlInGaP LEDs.

In a favorable embodiment of the illumination system, the first category of light-emitting diodes comprises so-called flip-chip InGaN LEDs, and the second category of light-emitting diodes comprises transparent-substrate AlInGaP LEDs. In a favorable embodiment of the illumination system, the second category of light-emitting diodes comprises so-called truncated inverted pyramid shaped, transparent-substrate AlInGaP LEDs. This shaping of the AlInGaP LEDs significantly enhances the light extraction efficiency.

The first category of the light-emitting diodes comprises green and blue LEDs. These green and blue LED chips are customarily mounted on a sub mount. The first category of light-emitting diodes comprises a first translucent substrate provided with an active layer on an outer surface of the first translucent substrate facing the mounting substrate.

Bond wires provide electrical connection between the first category of the light-emitting diodes and the mounting substrate, e.g. a (metal-core) printed circuit board. Alternatively, electrical connection is provided through or at a side surface of the sub mount provide electrical connection between the first category of light-emitting diodes and the mounting substrate, where a first electrically conductive material provides electrical connection between the LED chip and the sub mount, and a second electrically conductive material provides electrical connection between the sub mount and the mounting substrate.

The second category of the light-emitting diodes comprises red or amber LEDs. The second category of light-emitting diodes comprises an active layer arranged in a second translucent substrate. Bond wires provide electrical connection between the second category of the light-emitting diodes to the mounting substrate. Alternatively, the sub mount for the second category of light emitting diodes is electrically conductive and provides the electrical connection of one of the electrodes of the LED to the mounting substrate without the need for a bond wire.

For the second category of the light-emitting diodes normally one of the bond wires issues from an upper surface of the second translucent substrate. By mounting the second category of the light-emitting diodes also on a sub mount any differences in height of the surface of the LED facing the PCB between the first and the second category of the light-emitting diodes is reduced. As a consequence, the system performance is improved. Additionally, the sub mounts for the second category of LEDs can be shaped such that the heat spreading is enhanced thereby avoiding that heat generated by the LEDs reaches layers with a lower coefficient of thermal conduction; in this manner the junction temperature of the LEDs is reduced and the efficacy of the LEDs is improved. Although mounting the second category of the light-emitting diodes on a sub mount is not a prerequisite for the proper operation of these face-up (i.e., with both electrical contacts at the upper side of the LED, facing away from the mounting substrate) or vertical-structure (i.e., one electrical contact at the upper side of the LED, facing away from the mounting substrate, and one electrical contact at the lower side of the LED, facing the mounting substrate) LED chips, the performance of the illumination system is improved by arranging these LEDs on a sub mount.

In the known illumination system the red LEDs are mounted at a lower position as compared to the green and blue LEDs. As a consequence the red or amber LED is less efficient because light emitted by the red or amber LEDs is absorbed by (the sides of) the sub mounts of the green and blue LEDs.

Preferably, the sub mounts of the LEDs have a larger average cross sectional surface area in a plane parallel to the mounting substrate and a larger surface area at a side facing the mounting substrate than the side of the LED facing the mounting substrate. As a consequence, the heat generated by the LED that is transferred to ambient via the mounting substrate is better spread before reaching a medium with a higher thermal resistance, as is usually the case for electrically insulating materials; in this manner the overall thermal resistance between the junction of the LED and a heat sink or ambient is reduced. This is, in particular, relevant for AlInGaP LEDs that show a very strong depreciation of the luminous output with increasing junction temperature.

In order to further improve the performance of the illumination system, the sub mounts are made reflective. To this end a preferred embodiment of the illumination system according to the invention is characterized in that at least part of an outer surface of the second sub mount facing away from the mounting substrate is reflective or provided with a reflective coating. A silver top layer is a very suitable reflective coating. In addition, a preferred embodiment of the illumination system according to the invention is characterized in that side surfaces of the first and/or the second sub mount are reflective or are provided with a reflective coating.

A further improvement of the performance of the illumination system is obtained by changing the orientation of the side surfaces of the sub mounts. To this end a preferred embodiment of the illumination system according to the invention is characterized in that the side surfaces of the first and/or the second sub mount are tilted such that light reflected at the side surfaces is directed away from the printed circuit board. Preferably, the side of the sub mount facing the mounting substrate has a larger surface area than the side facing the LED. The additional advantage is the extra heat spreading before passing the electrically insulating layer. Heat spreading is favorable when the LEDs are driven in series.

These and other aspects of the invention are apparent from and will be elucidated with reference to the embodiments described hereinafter.

Figure 2B:
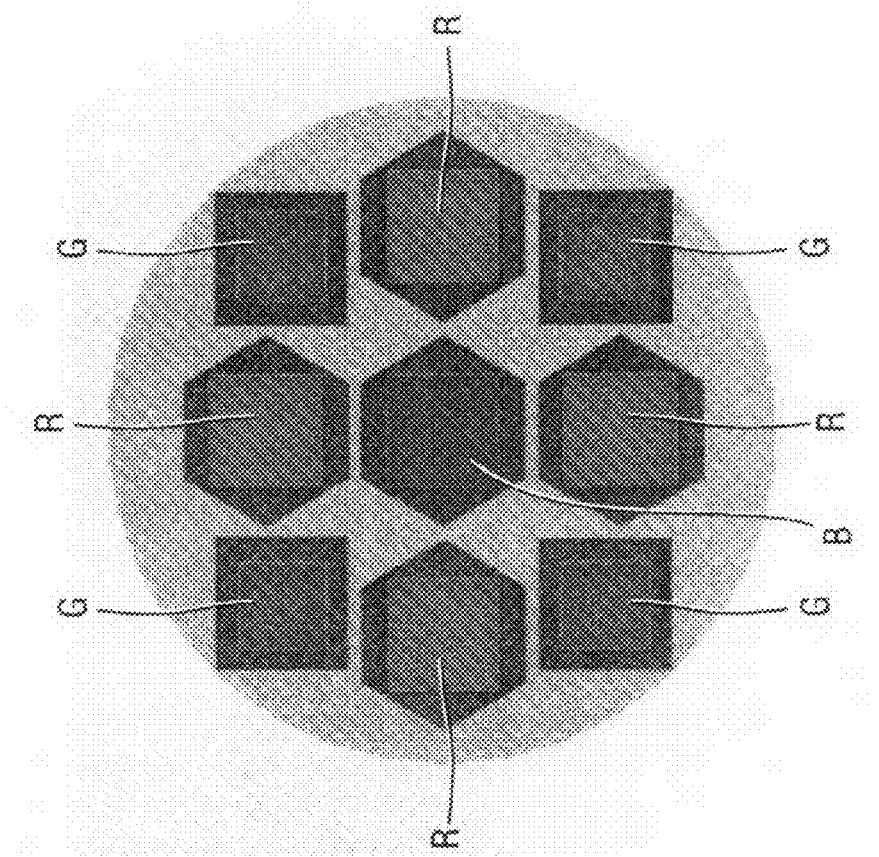
Figure 2A:
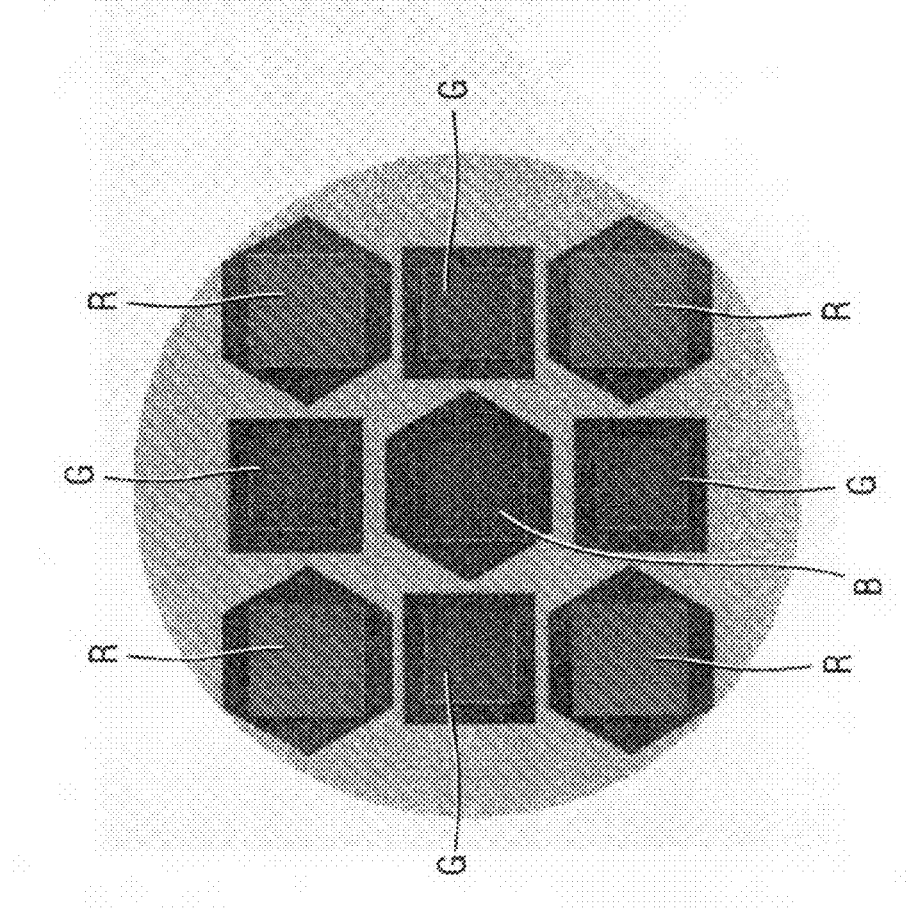

In the drawings:

FIG. 1 is a cross-sectional view of an embodiment of the illumination system according to the invention, and FIGS. 2A and 2B show examples of favorable configurations of light emitters in the light source.

The Figures are purely diagrammatic and not drawn to scale. Notably, some dimensions are shown in a strongly exaggerated form for the sake of clarity. Similar components in the Figures are denoted as much as possible by the same reference numerals.

FIG. 1 very schematically shows a cross-sectional view of a first embodiment of the illumination system according to the invention. The illumination system comprises a mounting substrate 4, in this case a metal-core printed circuit board. In the example of FIG. 1, the printed circuit board comprises an aluminum mounting substrate 41, a layer 42 of a dielectrical material, for instance glass filled epoxy, a ceramic, or a combination thereof, and a pre-determined pattern 43 of electrical conductive layers, for instance made of Cu. The pre-determined pattern provides electrical connection to the light-emitting diodes. The illumination system further comprises a plurality of light-emitting diodes R, A; G, B emitting light in a direction facing away from the light-emitting surfaces of the LEDs.

LEDs can be light emitters of distinct primary colors, such as in the example of FIG. 1, the well-known red R, amber A, green G, or blue B light emitters. Alternatively, the light emitter can have, for example, magenta or cyan as primary color. The primary colors may be either generated directly by the light-emitting-diode chip, or may be generated by a phosphor upon irradiance with light from the light-emitting-diode chip. In the latter case, also mixed colors or white light is possible as one of the primary colors. In general, LEDs have relatively high source brightness. Preferably, each of the LEDs has a radiant power output of at least 25 mW when driven at nominal power and at room temperature of the LED junction generating the light. LEDs having such a high output are also referred to as LED power packages. The use of such high-efficiency, high-output LEDs has the specific advantage that, at a desired, comparatively high light output, the number of LEDs may be comparatively small. This has a positive effect on the compactness and the efficiency of the illumination system to be manufactured. If LED power packages are mounted on such a (metal-core) printed circuit board, the heat generated by the LEDs can be readily dissipated by heat conduction via the PCB. In a favorable embodiment of the illumination system, the (metal-core) printed circuit board is in contact with a housing (not shown in FIG. 1) of the illumination system via a heat-conducting connection.

The illumination system may be provided with a light-exit window (not shown in FIG. 1). Preferably, the light-exit window is provided in the form of a dome. Preferably, the dome covering the LEDs comprises a transparent or translucent dielectric, preferably with an index of refraction larger than 1.3. Alternatively, the LEDs are covered with a light-extraction enhancing encapsulant. For clarity reasons, only one LED of the first category of the light-emitting diodes, referenced G; B, and only one LED of the second category of the light-emitting diodes, referenced R; A is shown in the example of FIG. 1.

The first category of the light-emitting diodes G, B comprises a first translucent substrate 11 provided with an active layer 1 on an outer surface 13 of the first translucent substrate 11 facing the printed circuit board 4. Preferably, the first translucent substrate is made from sapphire. Preferably, the first category of light-emitting diodes G, B comprises InGaN light-emitting diodes. The first category of light-emitting diode G, B is provided on a first sub mount 21, that is provided with an electrical circuitry on and/or in the sub mount 21, via an electrically conducting die attach material, referenced 51, e.g. a solder, e.g. PbSn, AuSn, In, or an Indium alloy. The first sub mount 21 is made of a thermally well conducting material, e.g. Si, or a ceramic, e.g. AlN, that enables application of the required electrical circuitry to electrically connect the LED, and has a coefficient of thermal expansion that allows for robust and reliable mounting of the die. The first sub mount 21 is provided on the printed circuit board 4 via a thermal interconnect material 31, e.g. a solder, e.g. In, an In alloy, PbSn, or AuSn, or a thermally well conducting glue, e.g. a silver filled epoxy, or an electrically isolating glue that has a sufficiently low thermal resistance, e.g. by realization of a very thin die attach layer. Bond wires 26; 27 provide electrical contact between the LED and the pre-determined pattern 43 of electrical conductive layers via respective electrical conductive layers 36; 37.

The second category of the light-emitting diodes R, A comprising an active layer 2 arranged in a second translucent substrate 12. According to the invention, the second category of light-emitting diodes R, A is provided on a second sub mount 22 via an electrically conducting die attach material, referenced 52. The second sub mount 22 is provided on the mounting substrate 4 via a thermal interconnect material 32. Preferably, the second category of light-emitting diodes R, A comprises AlInGaP light-emitting diodes. Bond wires 28, 29 provide electrical contact between the LED and the pre-determined pattern 43 of electrical conductive layers. Contact between bond wire referenced 28 is provided via an electrical conductive layer referenced 38.

Preferably, the first category of light-emitting diodes comprises flip-chip InGaN LEDs, and the second category of light-emitting diodes comprises transparent-substrate AlInGaP LEDs. Preferably, the second category of light-emitting diodes comprises truncated inverted pyramid shaped, transparent-substrate AlInGaP LEDs. This shaping of the AlInGaP LEDs significantly enhances the light extraction efficiency.

In order to further enhance the efficiency of the light emitted by the illumination system, an outer surface 16 of the second sub mount 22 facing away from the mounting substrate 4 is reflective or provided with a reflective coating 18. In addition, side surfaces 16', 16" of the second sub mount 22 are reflective or are provided with a reflective coating 18', 18". In an alternative embodiment also side surfaces of the first sub mount 21 are reflective or are provided with a reflective coating (not shown in FIG. 1).

In order to further enhance the efficiency of the light emitted by the illumination system, the side surfaces 16'; 16" of the second sub mount 22 are tilted such that light reflected at the side surfaces is directed away from the mounting substrate 4. In an alternative embodiment the side surfaces of the first sub mount 21 are tilted in a similar manner.

FIGS. 2A and 2B schematically show examples of favorable configurations of light emitters in the light source. The maximum dimension of both configurations is 6 mm in diameter. Each of the examples comprises 9 LEDs with a 4:4:1 chip ratio for the respective colors R, G and B. This configuration depends on the efficacy of the respective LEDs and can be suitably adapted. In the examples as shown in FIGS. 2A and 2B, the light emitters R, G, B are arranged such that the primary colors are distributed substantially rotationally symmetric. By having a relatively high rotational symmetry in the layout of the light emitters R, G, B, the color homogeneity of the light emitted by the illumination system is substantially improved.

The diameter of both designs as shown in FIGS. 2A and 2B is approximately 6 mm diameter. The minimal distance between the sub mounts is approximately 100 μm. In this case, the InGaN LEDs are mounted on hexagonal sub mounts and the AlInGaP LEDs are mounted on square sub mounts, resulting in compact multi-chip configurations with good overall performance. As an example, in the Luxeon® packages the AlInGaP LEDs are mounted directly on the heat sink, and the InGaN LEDs are mounted on a Si sub mount. The efficacy of the illumination system according to the invention was measured for an illumination system where both the InGaN LEDs and the AlInGaP LEDs are arranged on individual sub mounts and compared to an illumination system with the same LED configuration but where only the InGaN LEDs are arranged on a sub mount. Table I shows the results with respect to efficacy and color homogeneity of the illumination system.

TABLE I

Efficiencies and color homogeneity for three different sub mount heights for the red LEDs in the configuration as shown in FIG. 2A.

| Height of sub mount | Efficiency (%) | | | Color Homogeneity | |
|---|---|---|---|---|---|
| for a red LED | blue | green | red | ΔUV < 0.01 | ΔUV < 0.005 |
| 250 μm | 94.3 | 96.6 | 93.0 | 100 | 97.8 |
| 175 μm | 95.7 | 97.5 | 89.8 | 100 | 97.5 |
| no sub mount | 97.8 | 98.7 | 82.1 | 100 | 97.3 |

All sub mounts are provided with a reflective top surface. The height of the sub mounts of the blue and green LEDs is 250 μm.

From Table I it can be learned, for the LED configuration as shown in FIG. 2A, that the red efficiency increases more than 10% for a sub mount height of 250 μm compared to the configuration with red LEDs mounted without sub mount, while the green efficiency drops only by approximately 2% and the blue efficiency drops only by approximately 3.5%. The color homogeneity of the beam emitted by the illumination system is comparable for the three solutions. In general, the total efficiency gain is dependent of the flux ratio, which is used for the three colored components. In particular for white light with a low color temperature, e.g. 2500 K or 3000 K, the fraction of blue is relatively limited and the overall efficiency gain is significant. The results as presented in Table I are for identical junction temperatures of the LED in the respective illumination systems (i.e., with and without a sub mount for the AlInGaP LEDs). The additional heat spreading in the sub mount of the AlInGaP LED enables the enhancement of the efficacy of this LED is further enhanced, thus further increasing the overall system performance. By mounting each of the categories of light-emitting diodes in the illumination system according to the invention on a sub mount, the efficacy of the illumination system is improved. In addition, the packing density of the illumination system can be increased.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination system comprising:
a mounting substrate (4) for mounting and electrically contacting a plurality of light-emitting diodes (R, A, G, B),
a first category of the light-emitting diodes (G, B) comprising a first translucent substrate (11) provided with an active layer (1) on an outer surface (13) of the first translucent substrate (11) facing the mounting substrate (4), electrical contacts being provided at a side facing the mounting substrate (4), a second category of the light-emitting diodes (R, A) comprising an active layer (2) arranged on a second translucent substrate (12), at least one electrical contact being provided at a side facing away from the mounting substrate (4), each light-emitting diode (G, B) of the first category being provided on a first sub mount (21), each light-emitting diode (R, A) of the second category being provided on a second sub mount (22), the first (21) and the second (22) sub mount being provided on the mounting substrate (4).

2. An illumination system as claimed in claim 1, wherein the first category of light-emitting diodes (G, B) comprises InGaN light-emitting diodes, and the second category of light-emitting diodes (R, A) comprises AlInGaP light-emitting diodes.

3. An illumination system as claimed in claim 1, wherein the first category of light-emitting diodes (G, B) comprises flip-chip InGaN light-emitting diodes and the second category of light-emitting diodes (R, A) comprises transparent-substrate AlInGaP light-emitting diodes.

4. An illumination system as claimed in claim 1, wherein the second category of light-emitting diodes (R, A) comprises truncated inverted pyramid shaped, transparent-substrate AlInGaP LEDs.

5. An illumination system as claimed in claim 1, wherein at least part of an outer surface (16) of the second sub mount (22) facing away from the mounting substrate (4) is reflective or provided with a reflective coating (18).

6. An illumination system as claimed in claim 1, wherein side surfaces (16', 16") of the first and/or the second sub mount (21; 22) are reflective or are provided with a reflective coating (18', 18").

7. An illumination system as claimed in claim 6, wherein the side surfaces (16'; 16") of the first and/or the second sub mount (21; 22) are tilted such that light reflected at the side surfaces is directed away from the mounting substrate (4).

8. An illumination system as claimed in claim 1, wherein each of the light-emitting diodes (R, G, B) has a radiant power output of at least 25 mW when driven at nominal power and with the light-generating junction of the light emitting diodes (R, G, B) at room temperature.

* * * * *